(12) United States Patent
Shigeta et al.

(10) Patent No.: US 8,390,710 B2
(45) Date of Patent: Mar. 5, 2013

(54) IMAGE PICKUP SYSTEM, METHOD FOR DRIVING IMAGE PICKUP ELEMENTS, AND RECORDING MEDIUM

(75) Inventors: Kazuyuki Shigeta, Yokohama (JP); Takeru Suzuki, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 706 days.

(21) Appl. No.: 12/327,887

(22) Filed: Dec. 4, 2008

(65) Prior Publication Data

US 2009/0160947 A1   Jun. 25, 2009

(30) Foreign Application Priority Data

Dec. 19, 2007  (JP) ................................ 2007-327400
Oct. 1, 2008  (JP) ................................ 2008-256416

(51) Int. Cl.
*H04N 3/14* (2006.01)
*H04N 5/335* (2011.01)

(52) U.S. Cl. ........................................ 348/296; 348/294
(58) Field of Classification Search .......... 348/143–155, 348/294–324
See application file for complete search history.

(56) References Cited

U.S. PATENT DOCUMENTS

| 6,204,879 | B1 * | 3/2001 | Koseki et al. | 348/230.1 |
| 7,193,647 | B2 * | 3/2007 | Voss et al. | 348/220.1 |
| 2007/0126909 | A1 | 6/2007 | Kuruma | 348/333.01 |
| 2008/0291304 | A1 | 11/2008 | Ota et al. | 348/294 |
| 2009/0021621 | A1 | 1/2009 | Hashimoto et al. | 348/300 |

FOREIGN PATENT DOCUMENTS

| JP | 9-0214836 A | 8/1997 |
| JP | 2000-032318 A | 1/2000 |
| JP | 2007-150643 A | 6/2007 |

* cited by examiner

*Primary Examiner* — Anthony J Daniels
(74) *Attorney, Agent, or Firm* — Fitzpatrick, Cella, Harper & Scinto

(57) ABSTRACT

An image pickup system includes an image pickup element with an image pickup region in which a plurality of pixels are arranged in a matrix, and a controller configured to control reading of signals from the pixels. The controller divides a first frame period in which a first image is read from the image pickup element into a plurality of divided frame periods, including first and second divided frame periods. When the number of pixels included in the first image is larger than the number of pixels included in a second image, a second frame period required for reading all signals from the pixels included in the second image is inserted between the first and second divided frame periods. A refresh cycle of the second image is shorter than a refresh cycle of the first image.

16 Claims, 14 Drawing Sheets

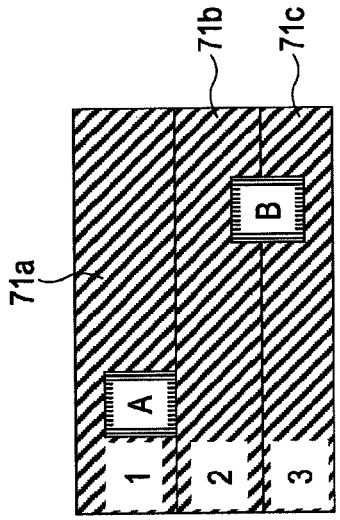
FIG. 7A
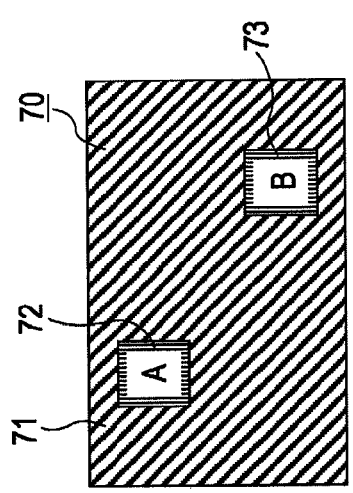
FIG. 7B
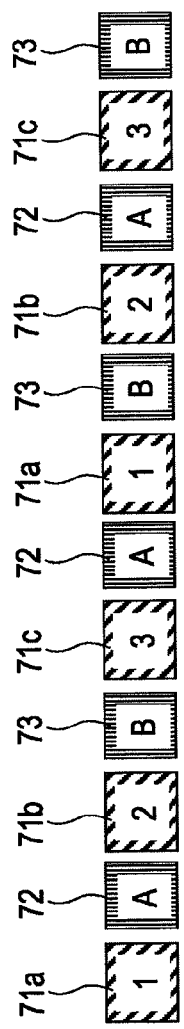
FIG. 7C
FIG. 7D

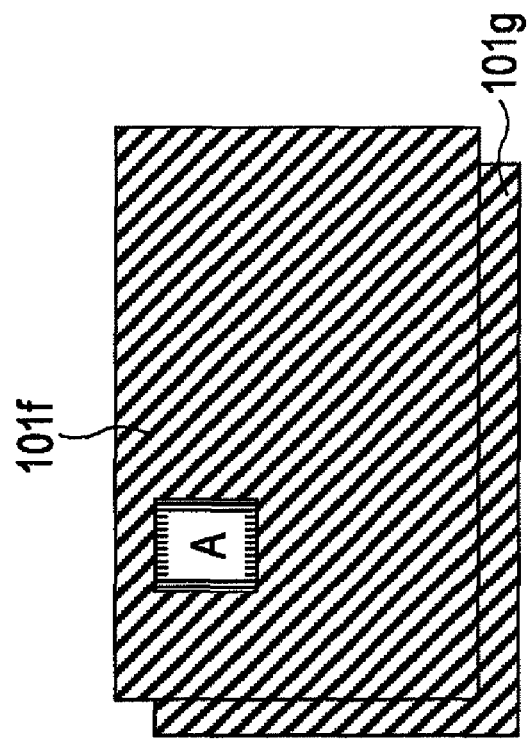
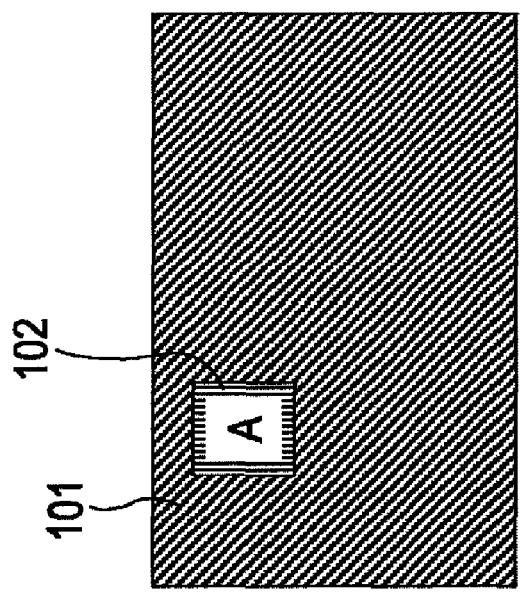

IMAGE PICKUP SYSTEM, METHOD FOR DRIVING IMAGE PICKUP ELEMENTS, AND RECORDING MEDIUM

BACKGROUND

1. Field of the Invention

The present invention relates to a method for driving an image pickup element, an image pickup system utilizing such an element, and a recording medium storing a program for implementing such a method.

2. Description of Related Art

Japanese Patents Laid-Open Nos. 09-214836 and 2000-032318, for example, disclose image pickup apparatuses capable of forming an image by obtaining image signals from different image pickup regions of a single image pickup element.

In Japanese Patent Laid-Open No. 09-214836, the image pickup apparatus has, as an operation of reading signals from the image pickup element, a skip mode in which pixels are thinned out and scanned, and a block mode in which a number of pixels (e.g., pixels in a predetermined region) are scanned but not thinned out. The image pickup apparatus performs scanning in each of the modes such that image data obtained from the scanning is read out on a frame-by-frame basis. Furthermore, in Japanese Patent Laid-Open No. 09-214836, images obtained through the skip mode and the block mode may be not only alternately read out on a frame-by-frame basis but also read out by changing a rate or frequency of a period of scanning in the skip mode to a period of scanning in the block mode.

In Japanese Patent Laid-Open No. 2000-032318, a method is disclosed for dividing a pixel array in which pixels are arranged in a matrix into a first portion and a second portion, reading signals from the first portion after pixels in the first portion are thinned out, and reading signals from all pixels in the second portion without thinning out the pixels in the second portion. In order to obtain an image in which the entire pixel array thereof is thinned out, among signals read from all the pixels, only signals of pixels in portions subjected to thinned-out scanning are read from a buffer memory arranged in a later stage of the image pickup element.

Japanese Patent Laid-Open No. 2007-150643 discloses a technique of realizing auto-focus processing that is performed faster than a period of a monitored image. As shown in FIG. 8B of Japanese Patent Laid-Open No. 2007-150643, when a plurality of auto-focus frames are provided, a sequence shown in FIG. 12 of Japanese Patent Laid-Open No. 2007-150643 is performed. Specifically, Japanese Patent Laid-Open No. 2007-150643 discloses a technique of repeatedly performing an operation of reading all of the plurality of auto-focus frames after a part of the monitored image is read.

For example, as shown in Japanese Patent Laid-Open No. 09-214836, in a case where low-density scanning is performed on pixels in an entire screen after thinning out and scanning are performed on all pixels in a specific region, the larger the number of pixels is in the image pickup element, the longer the time is required for reading the entire image. Therefore, as described in Japanese Patent Laid-Open No. 09-214836, when an image obtained in the skip mode and an image obtained in the block mode are alternately output, a speed of updating the image obtained in the block mode, which is a partial image that can be read at high speed, is limited by a speed of updating an entire image obtained in the skip mode, and thus the updating speed is lowered. When control of field angle and focus control are to be simultaneously performed, a high-quality image of a region of interest is required to be obtained and a refreshing speed is required to be high. According to the Japanese Patent Laid-Open No. 09-214836, the image of the region of interest may not be obtained at a sufficiently high refreshing speed.

Furthermore, when a relative rate or frequency of the skip mode to the block mode, which modes are to be switched from one to another, is changed, that is, when an operation of obtaining an entire image for a single screen after a partial image of interest is obtained for a plurality of screens (a plurality of frames) is repeatedly performed, an average refresh cycle of the partial image is reduced. However, because an update interval, i.e., a refresh cycle between two partial images obtained with the entire image being interposed therebetween, is different from refresh periods of partial images successively obtained without the entire image being interposed therebetween, there arises a problem in that movement of an obtained moving image has non-uniformities.

Moreover, in a case where a region to be read as the partial image is large and the entire image is considerably thinned out so as to be read with considerably low density, because the time required for reading the partial image is longer than the time required for reading the entire image, the refresh cycle of the entire image becomes large is limited by a speed of reading of the partial image. Under this condition, when the rate or frequency of the entire image to be read to the partial image to be read is changed, the problem described above arises. That is, there arises a problem in that a refreshing speed of an image that requires a shorter reading time is limited by a refreshing speed of an image that requires a longer reading time, and, accordingly, the refreshing speed of the image that requires the shorter reading time is deteriorated.

In the exemplary embodiment of Japanese Patent Laid-Open No. 2000-032318, because different regions in a certain single frame are subjected to different scanning operations, refreshing speeds of an entire image and a partial image are determined by a total reading time for the single frame. In this case, these refreshing speeds should be improved in order to make a refresh cycle of an image of interest shorter, which is difficult.

In addition, in an exemplary embodiment of Japanese Patent Laid-Open No. 2007-150643, assuming that a time period in which a part of the monitored image is read and a time period in which a plurality of auto-focus frames are read each corresponding to sub-frames, the following disadvantages arise. Specifically, when the monitored image is divided into four parts or portions, as shown in FIG. 12 of Japanese Patent Laid-Open No. 2007-150643, a period of eight sub-frames is required for updating the monitored image. On the other hand, a period of two sub-frames is required for updating the auto-focus frames. Therefore, a difference among exposure timings of the four portions obtained by dividing the monitored image becomes large. The larger the number of portions obtained by dividing the monitored image becomes, the larger the difference becomes.

SUMMARY OF THE INVENTION

The present invention, in an aspect thereof, provides an image pickup apparatus capable of obtaining an image in which a refresh cycle of the apparatus is shorter at high speed while a constant refresh cycle is maintained, when image signals are read from different image regions.

According to an exemplary embodiment of the present invention, there is provided an image pickup system that includes an image pickup element with an image pickup region in which a plurality of pixels are arranged in a matrix, and a controller configured to control reading of signals from the plurality of pixels. The controller divides a first frame period in which a first image is read from the image pickup element into a plurality of divided frame periods including first and second divided frame periods. When a number of pixels included in the first image is larger than a number of pixels included in a second image, a second frame period required for reading all signals from the pixels included in the second image is inserted between the first and second divided frame periods. A refresh cycle of the second image is shorter than a refresh cycle of the first image.

According to another exemplary embodiment of the present invention, there is provided a method for driving an image pickup element so that signals are read from pixels included in first and second images and output from the image pickup element. The image pickup element includes an image pickup region in which a plurality of pixels are arranged in a matrix. The method includes dividing a first frame period in which signals are read from pixels included in the first image into a plurality of divided frame periods including first and second divided frame periods, when a number of the pixels included in the first image is larger than a number of pixels included in the second image, inserting a second frame period required for reading all signals from the pixels included in the second image between the first and second divided frame periods, and making a refresh cycle of the second image shorter than a refresh cycle of the first image.

With this configuration, when image signals are read from different image regions, a constant refresh cycle that is shorter than a general refresh cycle can be maintained for an image in which a refresh cycle thereof is to be shorter, and consequently an unnatural moving image is avoided.

Further features of the present invention will become apparent from the following description of exemplary embodiments with reference to the attached drawings.

BRIEF DESCRIPTION OF THE DRAWINGS

FIGS. 7A to 7C are schematic diagrams illustrating a concept of a second exemplary embodiment of the present invention; and FIG. 7D is a diagram illustrating a conventional concept in related art.

FIGS. 10A and 10B are schematic diagrams illustrating a concept of a third exemplary embodiment of the present invention.

DESCRIPTION OF EXEMPLARY EMBODIMENTS

Figure 1A:
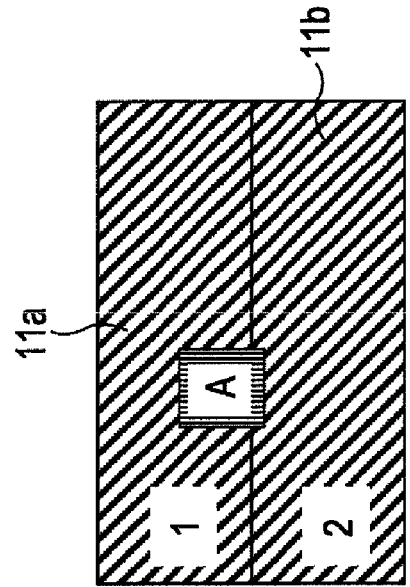
FIGS. 1A to 1C are schematic diagrams illustrating an aspect of the present invention.
Figure 1B:
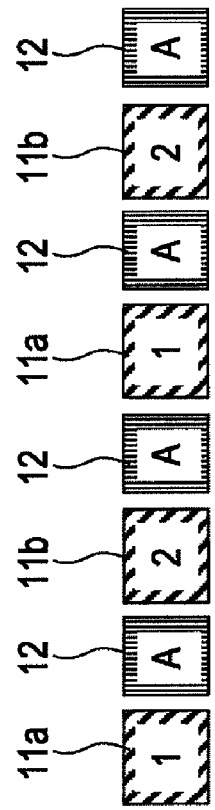
Figure 1C:
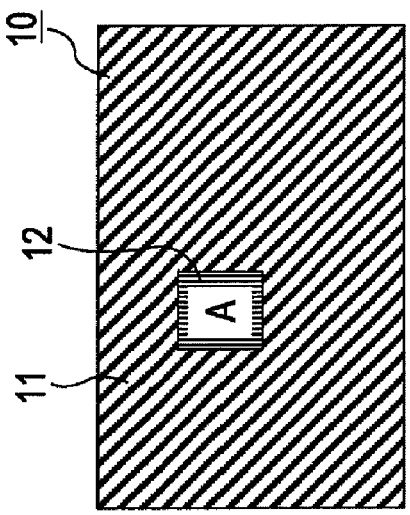

Referring to FIGS. 1A to 1C, an aspect of the present invention will be described. Note that an operation of reading a signal from a pixel includes an operation of outputting a signal from an image pickup element in accordance with a signal output from the pixel, unless otherwise specified herein.

FIG. 1A is a schematic diagram illustrating an image pickup region of an image pickup element, that is, an effective pixel region of the image pickup element according to exemplary embodiments of the present invention. An entire-region 11 includes pixels that output signals in a first density from an entire image pickup region 10, which serves as the effective pixel region of the image pickup element. A partial image 12 includes pixels that output signals in a second density from a portion of the image pickup region 10. The partial image 12 overlaps the entire-region 11. However, a description will be made hereinafter of a case in which pixels from which signals are output from the entire-region 11 are different from pixels from which signals are output from the partial image 12.

In FIG. 1A, when a period of time (e.g., one frame period) required for outputting signals from the entire-region 11 for a single screen is longer than a period of time (e.g., one frame period) required for outputting signals from the partial image 12 for a single screen, a refresh cycle of the partial image 12 is limited by a refresh cycle of an image of the entire-region 11. In the exemplary embodiments of the present invention, in order to shorten a refresh cycle of an image that requires a high-speed refresh, an image that does not require a high-speed refresh is divided into a plurality of images (for example, referred to as first and second divided images). Then, an operation of outputting signals from pixels included in the image that requires a high-speed refresh is inserted between operations of outputting signals from pixels corresponding to the first and second divided images.

For example, as shown in FIG. 1B, the entire-region 11 is divided into a first divided image 11a and a second divided image 11b. FIG. 1C is a diagram schematically illustrating timings in which signals are output from pixels included in the first divided image 11a, the second divided image 11b, and the partial image 12. An axis of abscissa (i.e., a horizontal axis (not shown)) denotes time. By obtaining signals of pixels of the partial image 12 for a single screen and inserting these signals between the signals output from the pixels of the first and second divided images 11a and 11b, an image of a desired region is obtained with a constant refresh cycle at a high refreshing speed, i.e., with a short refresh cycle.

First Exemplary Embodiment

In a first exemplary embodiment, an example of an operation of dividing an image in an entire-region into two divided images will be described.

Figure 2:
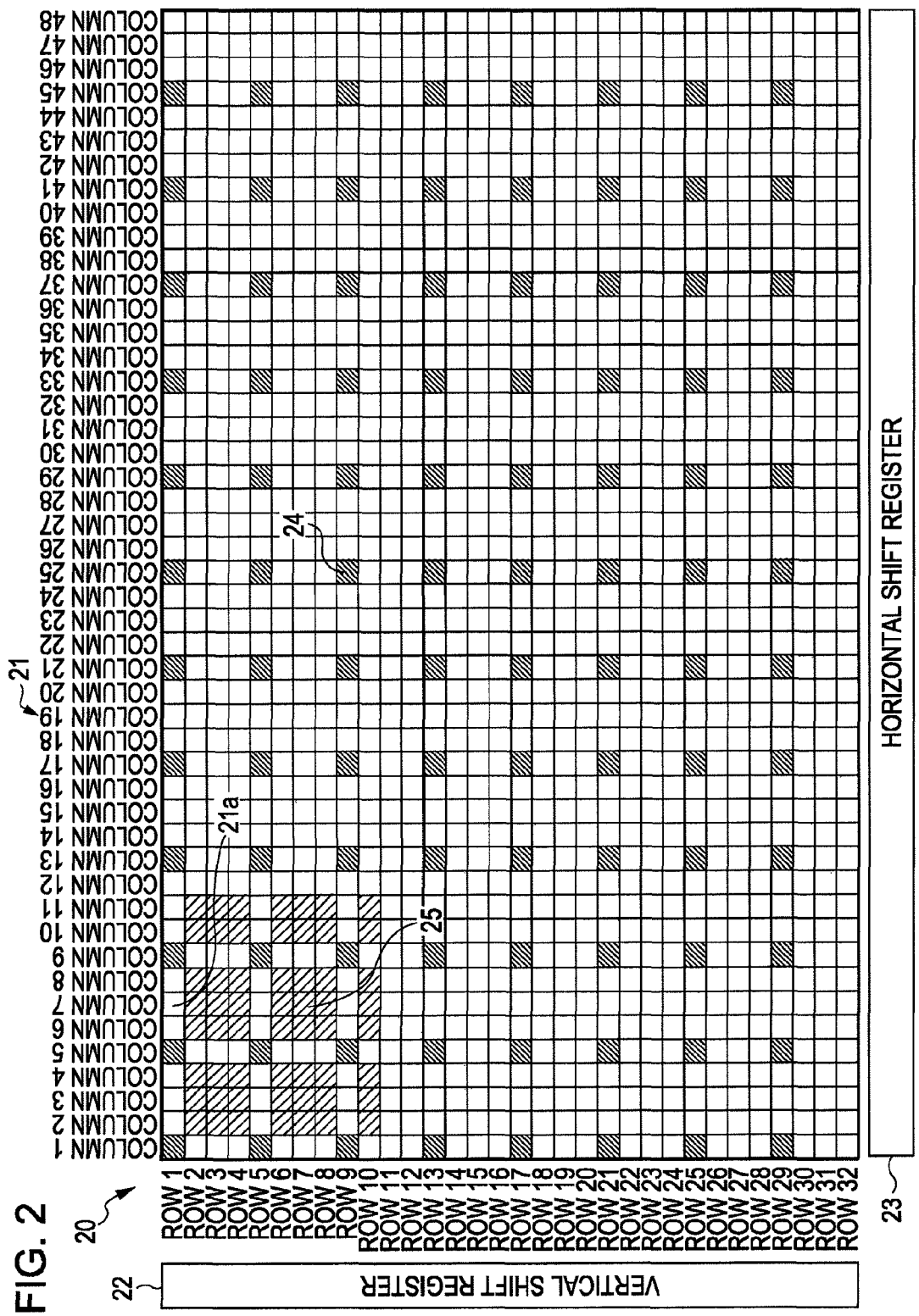
FIG. 2 is a diagram illustrating an effective pixel region according to a first exemplary embodiment of the present invention.

FIG. 2 schematically shows an effective pixel region 20 of the image pickup element, which corresponds to the image pickup region 10, and a vertical shift register 22 and a horizontal shift register 23, which control an operation of reading signals from pixels included in the effective pixel region 20. In the effective pixel region 20, pixels that generate electric signals in response to incident light are arranged in a matrix. The vertical shift register 22 and the horizontal shift register 23 scan the effective pixel region 20 in a vertical direction and a horizontal direction, respectively, and a method for scanning can be changed in accordance with a control performed by an external system control circuit unit (controller), which will be described hereinafter.

In FIG. 2, the effective pixel region 20 includes unit pixels 21a arranged in a matrix of 32 rows×48 columns, for example, for simplicity. Although not shown, in general, the image pickup element includes optical black pixels, which are light-shielded so as to prevent light from being incident thereon, which are arranged so as to surround the effective pixel region 20, and which are used for correction processing. The effective pixel region 20 is included in a pixel unit 21.

In FIG. 2, hatched portions denoted by reference numeral 24 correspond to entire-region thinned-out reading pixels and are pixels included in a first image to be read from the entire effective pixel region 20 in a first density. Different hatched regions denoted by reference numeral 25 correspond to partial-reading pixels and are pixels included in a second image to be read from a portion of the effective pixel region 20 in a second density. The entire-region thinned-out reading pixels 24 correspond to the entire-region 11 of FIG. 1, and the partial-reading pixels 25 correspond to the partial image 12 of FIG. 1.

In accordance with the signals read from the entire-region thinned-out reading pixels 24, an image that is derived from the entire effective pixel region 20 and that has a low density, that is, a low-resolution thinned-out image (or entire-region thinned-out image), is formed. On the other hand, in accordance with the signals read from the partial-reading pixels 25, an image that is derived from a portion of the effective pixel region 20 and that has a density higher than that of the entire-region thinned-out image, that is, a high-resolution thinned-out image (or partial image) is formed. Here, a period of time required for reading all the signals from the entire-region thinned-out reading pixels 24 and a period of time required for reading all the signals from the partial-reading pixels 25 correspond to one frame period. It is assumed that a period of time required for reading signals from the pixels included in the entire-region thinned-out image (first image) for a single screen is referred to as a first frame period, and a period of time required for reading signals from the pixels included in the partial image (second image) is referred to as a second frame period. Pixels to be included in the second image are selected so as to have a density higher than that of pixels to be included in the first image. Note that signals are not read from pixels that are not hatched in FIG. 2, in this exemplary embodiment.

Figure 3:
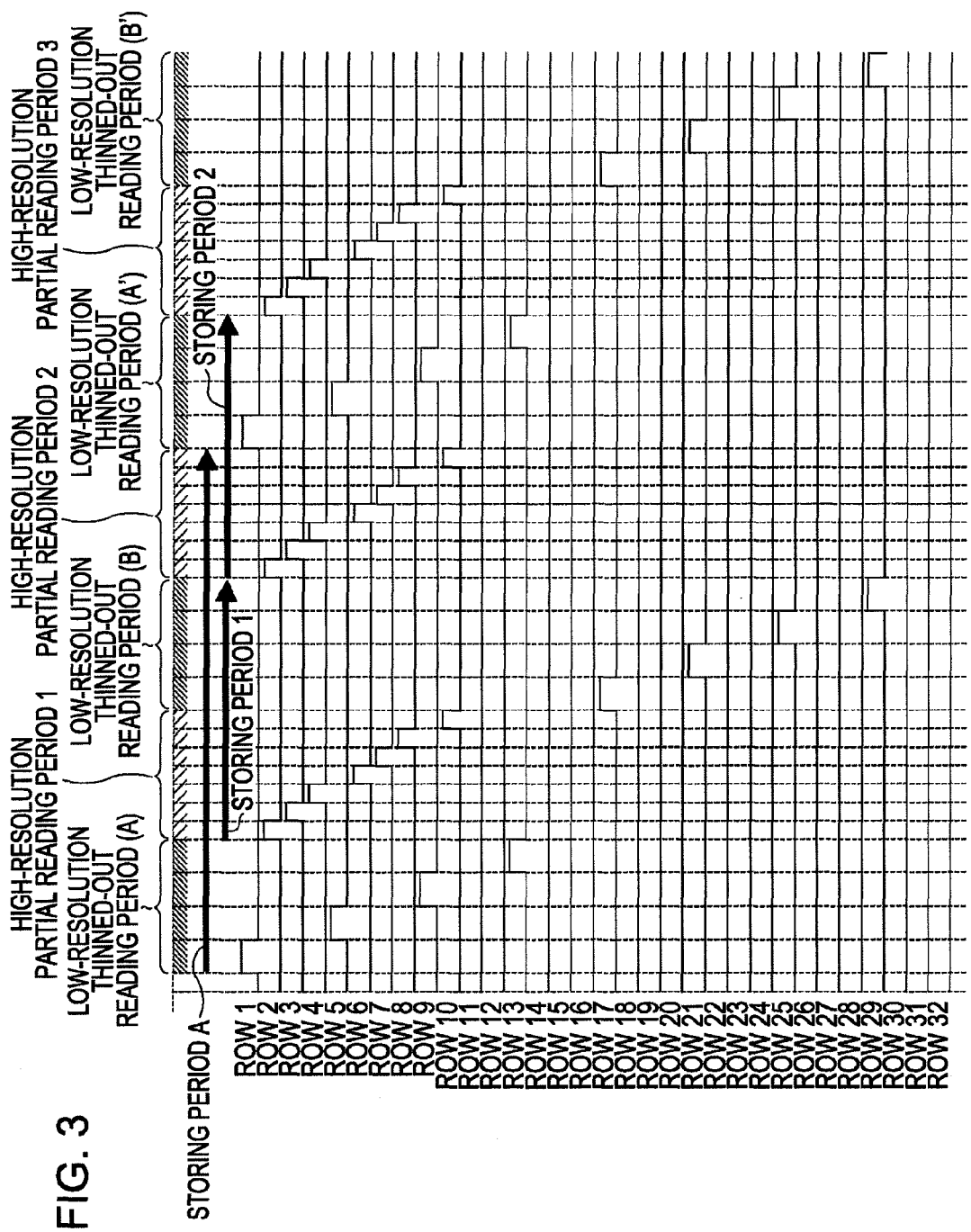
FIG. 3 is a timing chart illustrating a driving method according to the first exemplary embodiment of the present invention.

FIG. 3 is a timing chart illustrating examples of timings in which operations of reading signals from the pixels included in the first and second images of the effective pixel region 20 shown in FIG. 2 are performed. That is, FIG. 3 shows timings in which operations of reading signals from the pixels in the individual rows in the effective pixel region 20, and the operations are performed on the corresponding rows while corresponding pulses are at high levels.

A period of time required for reading signals from pixels among the entire-region thinned-out reading pixels 24 included in the first to 16th rows is referred to as a "first divided frame period", and a period of time required for reading signals from pixels among the entire-region thinned-out reading pixels 24 included in the 17th to 32nd rows is referred to as a "second divided frame period", hereinafter. Another frame period in which signals are read from the partial-reading pixels 25 is inserted between the first divided frame period and the second divided frame period. Specifically, the controller controls an operation of dividing the entire thinned-out image for a screen into a plurality of divided images (e.g., first to n-th divided images) and reading signals from pixels included in the divided images for individual first to n-th divided images in first to n-th divided frame periods, respectively, and further controls an operation of reading signals from pixels included in a partial image for a screen to be performed after each of the first to n-th divided frame periods.

The timings shown in FIG. 3 will now be described in detail. In the operations described above, the vertical shift register 22 scans the first row followed by the fifth, ninth, and 13th rows so as to scan every four rows that include the entire-region thinned-out reading pixels 24. Each time the scanning operations performed on these rows is terminated, the horizontal shift register 23 scans every four columns starting from the first column to the 48th column corresponding to one of the rows that has been scanned, as described above. In this way, among the signals to be output from the entire-region thinned-out reading pixels 24, signals corresponding to the pixels included in the first divided image are output (a low-resolution thinned-out reading period (A)). This low-resolution thinned-out reading period (A) corresponds to the first divided frame period.

Then, the vertical shift register 22 is reset so that another operation is to be performed. The first, fifth, ninth rows are skipped, and the second to fourth rows, the sixth to eighth rows, and the 10th row are scanned. As with the low-resolution thinned-out reading period (A), the horizontal shift register 23 scans pixels in the second to fourth columns, the sixth to eighth columns, and the 10th and 11th columns which correspond to pixels in the second to fourth rows, the sixth to eighth rows, and the 10th rows. In this way, the signals are output from the partial-reading pixels 25 (a first high-resolution partial reading period). This first high-resolution partial reading period corresponds to the second frame period in which the partial image is read.

As with the low-resolution thinned-out reading period (A), in a low-resolution thinned-out reading period (B) (the second divided frame period) following the first high-resolution partial reading period, the signals read from the entire-region thinned-out reading pixels 24 included in the second divided image are output from the image pickup element. In this way, the signals output in the low-resolution thinned-out reading period (A) and the signals output in the low-resolution thinned-out reading period (B) constitute the entire-region thinned-out image for a single screen.

In a second high-resolution partial reading period following the low-resolution thinned-out reading period (B), signals are again read from the pixels from which the signals were read in the first high-resolution partial reading period. That is, while the entire-region thinned-out image is updated for a screen, the partial image is updated for two screens. Because the operations described above are repeatedly performed thereafter, the entire-region thinned-out image and the partial image are updated at a ratio of one to two. That is, a refresh cycle of the second image is shorter than a refresh cycle of the first image.

Note that the signals that are output from the image pickup element after being read from the entire-region thinned-out reading pixels 24 included in the first and second divided images are synthesized in a signal processing circuit unit, which will be described hereinafter, for example, and are displayed in a reproducing/displaying unit, which will be described hereinafter, as an entire-region thinned-out image.

Periods of times (hereinafter referred to as storing periods) required for storing charges in the individual pixels when the operations in this exemplary embodiment are performed will now be described. The pixels in the effective pixel region 20 store charges in accordance with incident light, and signals obtained in accordance with an amount of the stored charges are output from the image pickup element. Magnitudes of the signals depend on durations of the storing periods. In FIG. 3, "STORING PERIOD A" denotes a storing period for pixels in the first row among the entire-region thinned-out reading pixels 24. In the low-resolution thinned-out reading period (A), signals are read in accordance with the charge stored in the pixels. A duration of time from a start of the low-resolution thinned-out reading period (A) to a time point before a "LOW-RESOLUTION THINNED-OUT READING PERIOD (A')" corresponds to the storing period A.

Next, when pixels in the second row among the partial-reading pixels 25 are taken as example, a duration of time from a start of the first high-resolution partial reading period in which signals are output in accordance with the charges that have been stored in the pixels to a time point before the second high-resolution partial reading period in which the signals are output corresponds to another storing period (e.g., a first storing period). A duration of a second storing period is the same as that of the first storing period.

The storing period A and the first and second storing periods denote maximum storing periods that the pixels can attain. However, when a shorter storing period is to be set, the pixels are reset in an arbitrary timing during each of the storing periods. Specifically, a signal used to reset the pixels is supplied from a timing control circuit unit, which will be described hereinafter, to the pixels.

Figure 4:
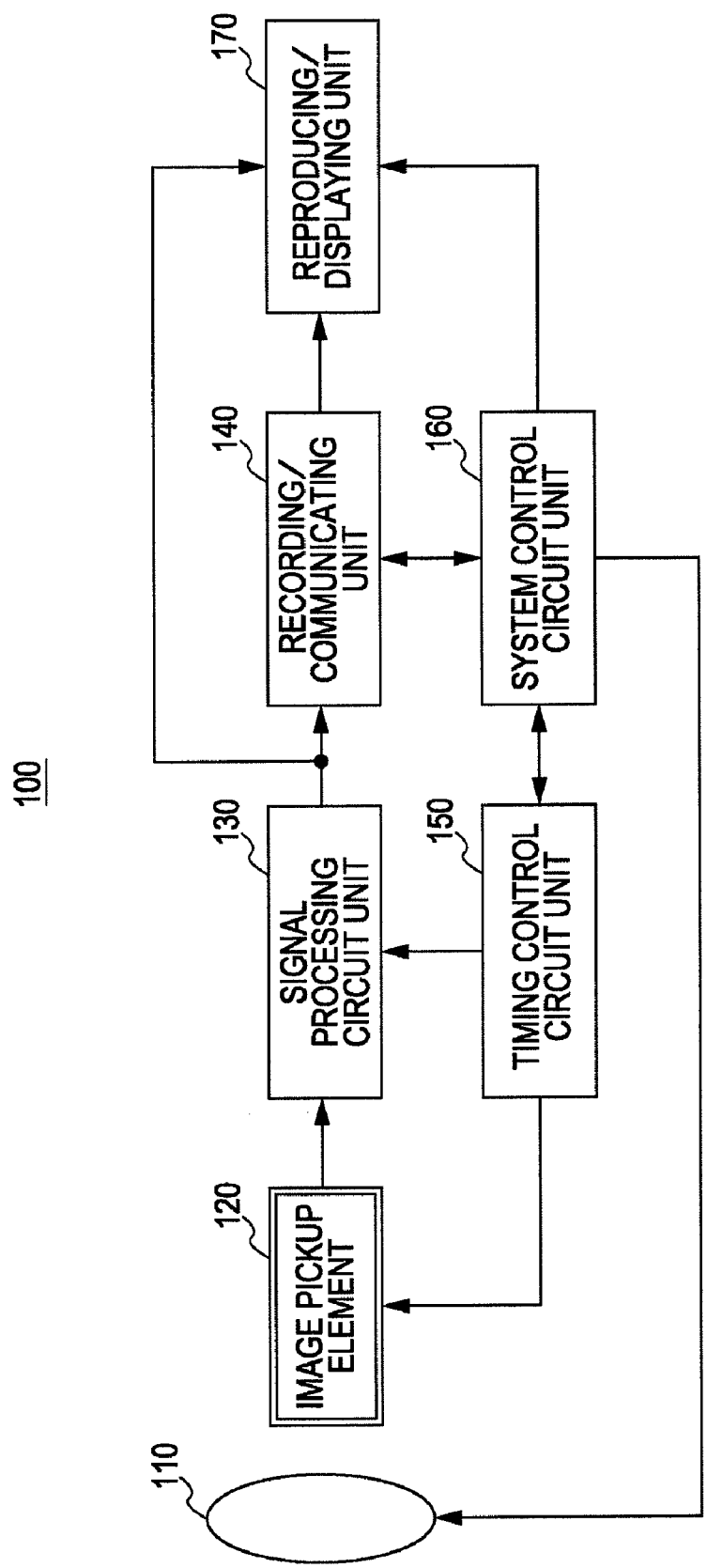
FIG. 4 is a block diagram illustrating an image pickup system according to the first exemplary embodiment of the present invention.

FIG. 4 is a block diagram schematically illustrating an image pickup system 100 that includes an image pickup element 120 of an image pickup apparatus according to the first exemplary embodiment of the present invention.

The image pickup system 100 includes an optical unit 110, the image pickup element 120, a signal processing circuit unit 130, a recording/communicating unit 140, a timing control circuit unit 150, a system control circuit unit 160, and a reproducing/displaying unit 170, for example.

The optical unit 110 introduces light emitted from an object to a pixel unit 21 of the image pickup element 120, in which a plurality of pixels are arranged in a matrix, so that an image of the object is formed. The pixel unit 21 includes an effective pixel region 20. The image pickup element 120 outputs an signal in accordance with the light used for forming the image in the pixel unit 21 in response to a signal supplied from the timing control circuit unit 150.

The signal output from the image pickup element 120 is input into the signal processing circuit unit 130. The signal processing circuit unit 130 performs processing such as AD conversion processing on the input electric signal in accordance with a method defined by a program, for example. The signal subjected to the processing using the signal processing circuit unit 130 is supplied to the recording/communicating unit 140. The recording/communicating unit 140 supplies a signal used to form an image to the reproducing/displaying unit 170, where a moving image or a still image is reproduced or displayed. The recording/communicating unit 140 communicates with the system control circuit unit 160 in response to the signal supplied from the signal processing circuit unit 130, and performs an operation of recording the signal used to form an image on a recording medium (not shown).

Figure 14:
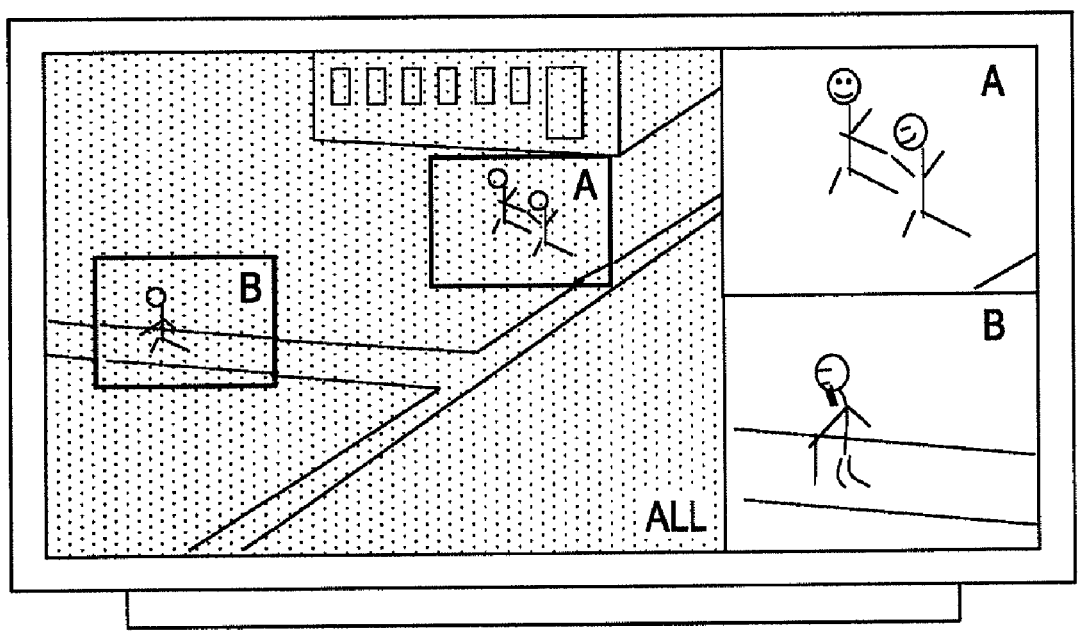
FIG. 14 is a schematic diagram illustrating a reproducing/displaying unit according to the first exemplary embodiment of the present invention.

FIG. 14 is a schematic diagram illustrating the reproducing/displaying unit 170. FIG. 14 shows a monitor corresponding to the reproducing/displaying unit 170, and the monitor shows an entire-region thinned-out image ALL in a left region thereof. In the entire-region thinned-out image ALL, portions A and B denote partial images. The monitor further shows enlarged images of the partial images A and B in a right region thereof. Note that although the entire-region thinned-out image ALL and the partial images A and B are displayed on a single monitor in this exemplary embodiment, they may be displayed on different monitors or arbitrarily some of them may be displayed on a single monitor.

For example, in a case where the image pickup system 100 is used as a monitoring system, it is necessary to roughly shoot a wide range so that an entire image is obtained and to precisely shoot a specific region in which attention to detail is to be paid. In particular, in the monitoring system, it is necessary to extract such a specific region with a high resolution and to update an extracted image at high frame speed. Accordingly, this exemplary embodiment is suitably applied to such a case.

The system control circuit unit 160 integrally controls operations of the image pickup system 100. Specifically, the system control circuit unit 160 controls driving operations of the optical unit 110, the timing control circuit unit 150, the recording/communicating unit 140, and the reproducing/displaying unit 170. Furthermore, the system control circuit unit 160 includes a storage unit (not shown) having a recording medium that stores a program, for example, used to control the operation of the image pickup system 100.

The timing control circuit unit 150 controls timings at which the image pickup element 120 and the signal processing circuit unit 130 are driven under control of the system control circuit unit 160 serving as a controller.

The system control circuit unit 160 may include a program used to determine the entire-region thinned-out image ALL and the partial images A and B. In this case, the entire-region thinned-out image ALL, the partial images A and B, and a density of pixels from which signals are to be read are determined before the operation of the image pickup system 100 so that an image, among the entire-region thinned-out image ALL and the partial images A and B, which is divided into a plurality of divided images and which outputs signals, is determined. The system control circuit unit 160 may be configured so as to accept a user's operation (i.e., user input) through an interface (not shown). By this arrangement, when the image pickup system 100 is used as a monitoring system, the user is allowed to specify a region to be extracted as a partial image having a high resolution.

Furthermore, the controller may control progressive scanning, in which pixels in an effective pixel region are successively scanned from a first row, and interlace scanning, in which the pixels are scanned every other row. Furthermore, the controller may control a scanning operation that is performed so that some pixels are thinned out only from an entire image pickup region without obtaining signals from pixels included in a partial image, and a scanning operation that is performed so that only a region corresponding to the partial image is scanned without obtaining signals from pixels included in the entire image. Note that the image pickup system 100 of this exemplary embodiment may be applicable to other exemplary embodiments of the present invention, which will be described hereinafter.

Figure 5:
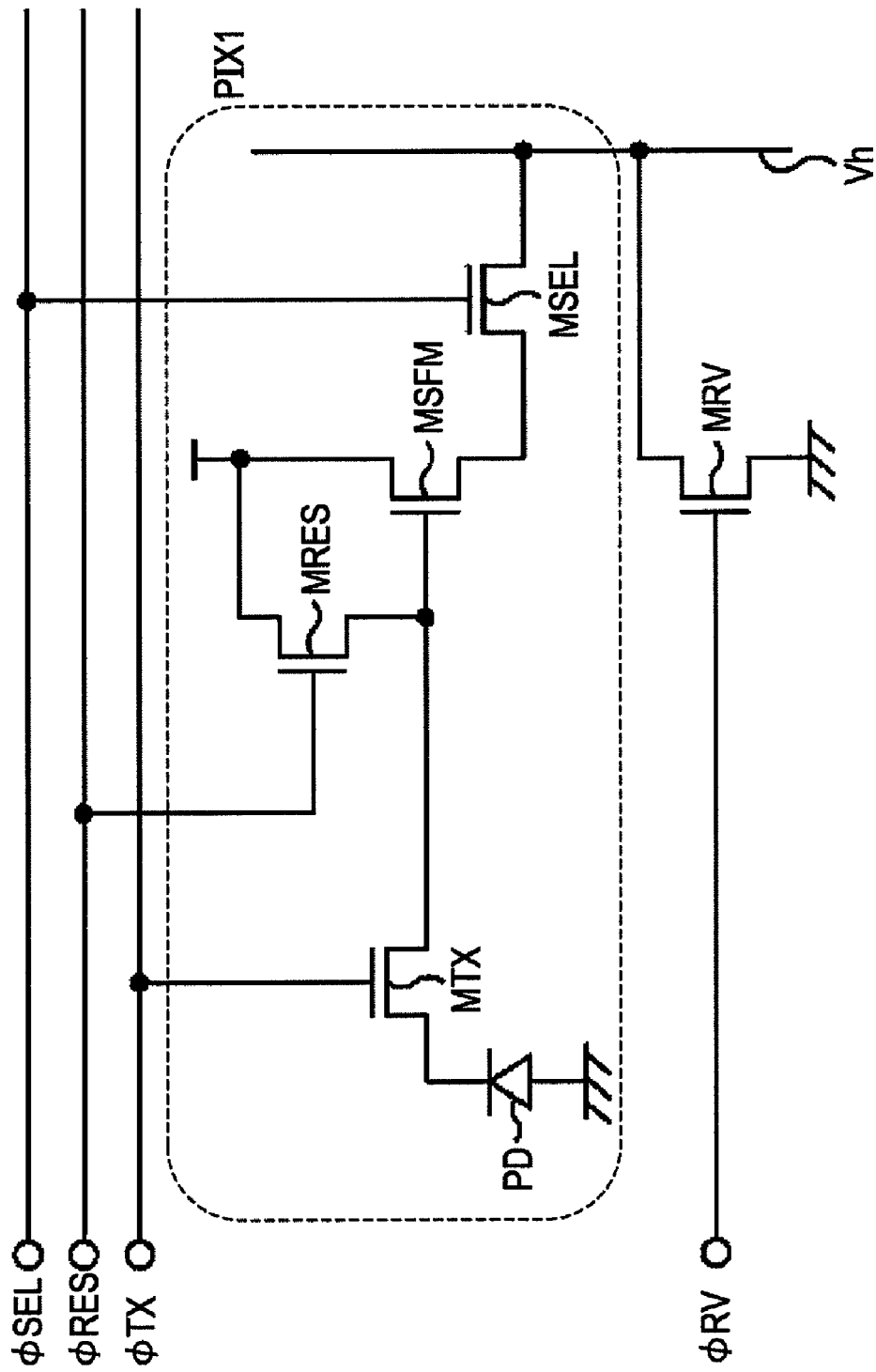
FIG. 5 is a diagram illustrating an example of a configuration of a pixel.
Figure 6:
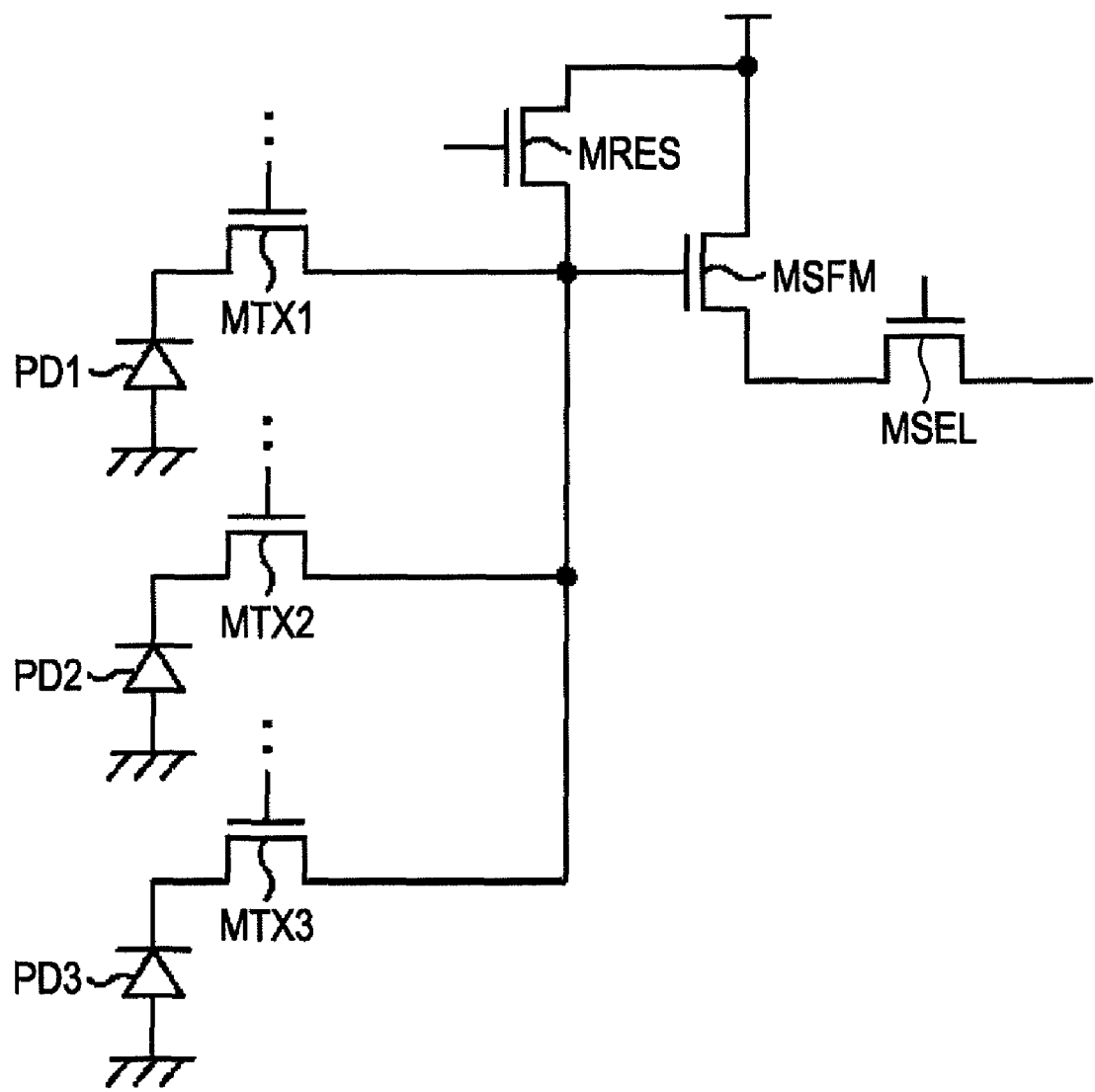
FIG. 6 is a diagram illustrating examples of configurations of pixels.

Referring to FIGS. 5 and 6, an example of a configuration of one of the pixels in the image pickup element 120 will be described. FIG. 5 shows a diagram schematically illustrating one of the pixels. A pixel PIX1 includes a photodiode PD, which photoelectrically converts light from an object and holds a charge, and a pixel amplifier MSFM, which amplifies a signal generated in accordance with charge held in the photodiode PD. In addition, the pixel PIX1 includes a transfer switch MTX, which controls transfer of the charge held in the photodiode PD to a gate of the pixel amplifier MSFM, a resetting switch MRES used to set the gate of the pixel amplifier MSFM to have a predetermined potential, and a selection switch MSEL used to bring the pixel PIX1 to a selection state. When the selection switch MSEL is brought to a conductive state, the pixel amplifier MSFM and a load switch MRV, which is a constant-current-source load connected to a vertical signal line Vh, constitute a source follower circuit. In this case, a potential corresponding to a potential of the gate of the pixel amplifier MSFM included in the pixel PIX1 is output as a signal from the pixel PIX1 to the vertical signal line Vh.

FIG. 6 shows examples of configurations of some of the pixels. In FIG. 6, a plurality of photodiodes PDn and a plurality of transfer switches MTXn respectively corresponding to the plurality of photodiodes PDn share a single resetting switch MRES, a single pixel amplifier MSFM, and a single selection switch MSEL. This configuration includes three pixels. With this configuration, a proportion of the resetting switch MRES, the pixel amplifier MSFM, and the selection switch MSEL for each of the photodiodes PDn becomes small and, accordingly, an aperture ratio for each of the photodiodes PDn can be improved.

Although not described herein, a general image pickup element may be configured so as to sample signals supplied to a vertical signal line or includes a CDS (Correlated Double Sampling) circuit used to remove noise. In this case, when a vertical shift register selects a row from which signals are to be output, the signals supplied to the vertical signal line are sampled into the CDS circuit. Furthermore, when a horizontal register performs progressive scanning, the sampled signals are output from the image pickup element.

According to this exemplary embodiment, when a refresh cycle of a partial image is required to be shorter, a constant refresh cycle of a partial image that is shorter than a general refresh cycle is attained, and accordingly, an unnatural moving image can be avoided.

In this exemplary embodiment, the entire screen is divided into two. However, the entire image may be divided into three or more, and the entire screen should be divided by taking into consideration refreshing speeds of the partial image to be obtained.

Second Exemplary Embodiment

A second exemplary embodiment of the present invention will now be described with reference to FIGS. 7A to 9. The second exemplary embodiment is different from the first exemplary embodiment in that an image pickup region includes a plurality of partial images. As with the first exemplary embodiment, in the second exemplary embodiment, a description will be made of an example case in which, when a driving method in the related art is employed, duration times in which signals are output from pixels included in partial images are limited by a duration time in which signals are output from pixels in an entire-region.

FIG. 7A is a diagram schematically illustrating an effective pixel region serving as the image pickup region according to the second exemplary embodiment. An entire-region 71 includes pixels to be subjected to an operation of outputting signals from an entire image pickup region 70 in a first density. First and second partial images 72 and 73 include pixels to be subjected to operations of outputting signals from corresponding portions of the image pickup region 70 in a second density. Although the first and second partial images 72 and 73 are included in the entire-region 71, a description will be made hereinafter assuming that the pixels from which signals are to be read and that are included in the first and second partial images 72 and 73 are different from the pixels from which signals are to be read and that are included in the entire-region 71.

FIG. 7B is a diagram schematically illustrating an imaging plane obtained by dividing the entire-region 71 into first to third divided images each having slit or elongate shapes. FIG. 7C is a diagram schematically illustrating a sequence of operations of outputting signals read from pixels included in the first to third divided images and signals read from pixels included in the first and second partial images included in the first to third divided images, from an image pickup element. It is assumed that the signals are output in the following order: the signals obtained from the first divided image, the signals obtained from the first partial image, the signals obtained from the second divided image, signals obtained from the second partial image, signals obtained from the third divided image, and again signals obtained from the first partial image. The operation is repeatedly performed in this order.

Figure 8:
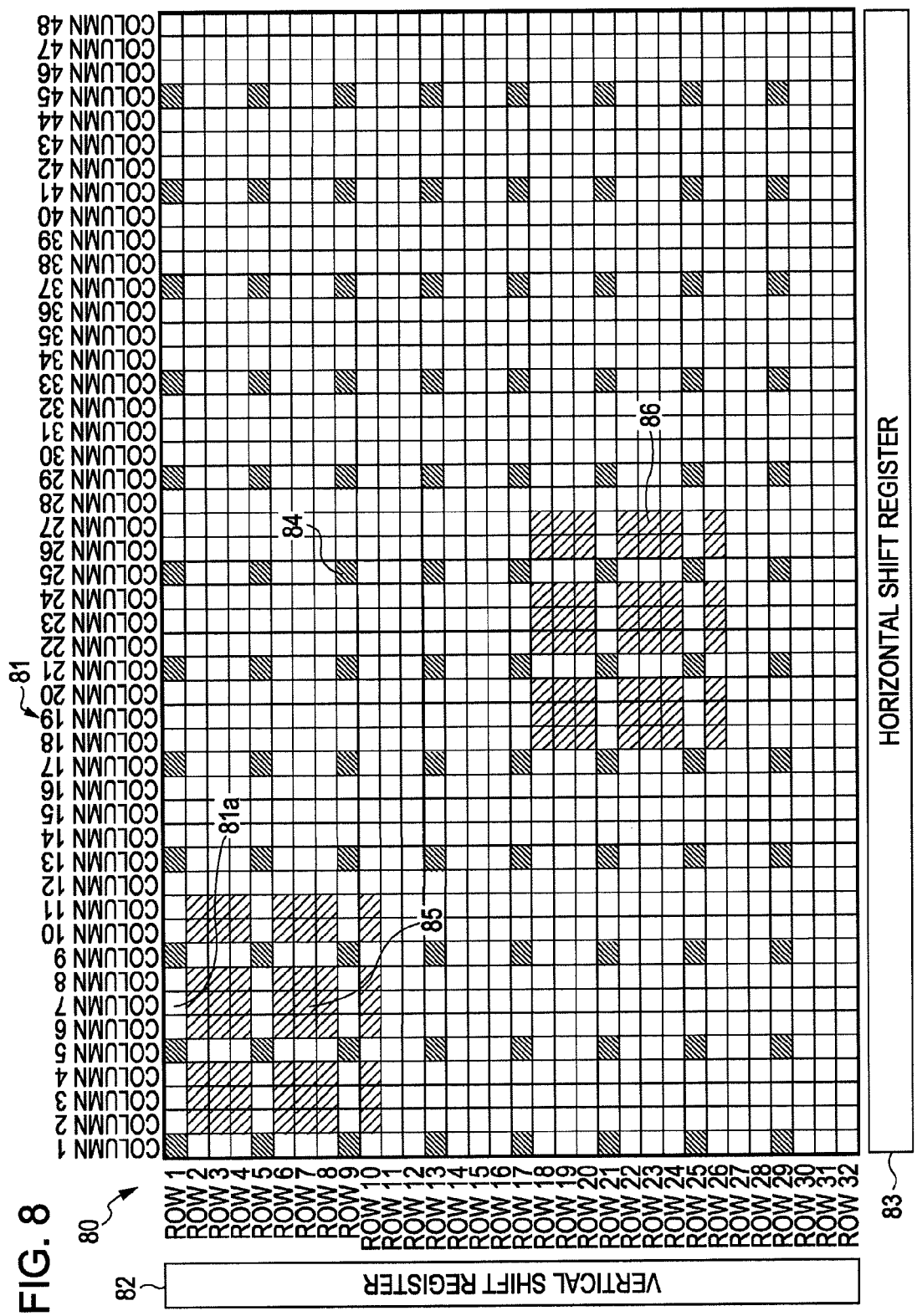
FIG. 8 is a diagram illustrating an effective pixel region according to the second exemplary embodiment of the present invention.

FIG. 8 is a diagram schematically illustrating an effective pixel region 80 corresponding to the image pickup region 70, and a vertical shift register 82 and a horizontal shift register 83 serving as controllers that control operations of reading signals from pixels included in the effective pixel region 80. The vertical shift register 82 and the horizontal shift register 83 scan the effective pixel region 80 in a vertical direction and a horizontal direction, respectively, and can change a method for scanning under control of a system control circuit unit separately provided, which is similar to the system control circuit unit 160 of the first exemplary embodiment.

In FIG. 8, the effective pixel region 80 includes unit pixels 81a arranged in a matrix of 32 rows×48 columns, for example, for simplicity. Although not shown, as with the case of FIG. 2, pixels used to correct signals, such as optical black pixels, may be arranged so as to surround the effective pixel region 80. The effective pixel region 80 is included in a pixel unit 81.

In FIG. 8, hatched portions denoted by reference numeral 84 correspond to entire-region thinned-out reading pixels and are pixels included in a first image to be read from the entire effective pixel region 80 in a first density. Different hatched regions denoted by reference numerals 85 and 86 correspond to partial-reading pixels and are pixels included in second images to be read from portions of the effective pixel region 80 in a second density. The partial-reading pixels 85 correspond to the first partial image 72 of FIG. 7A and the partial-reading pixels 86 correspond to the second partial image 73 of FIG. 7A. The entire-region thinned-out reading pixels 84 correspond to the entire-region 71 of FIG. 7A.

In accordance with signals read from the entire-region thinned-out reading pixels 84, an image that is derived from the entire effective pixel region 80 and that has a low density, that is, a low-resolution thinned-out image (entire-region thinned-out image), is formed. On the other hand, in accordance with the signals read from the partial-reading pixels 85 and 86, images that are derived from the portions of the effective pixel region 80 and that have a density higher than that of the entire-region thinned-out image, that is, high-resolution thinned-out images (partial images) are formed. It is assumed that a period of time required for reading signals from pixels of the entire-region thinned-out image for a single screen is referred to as a first frame period, and a period of time required for reading signals from pixels of each of the first and second partial images is referred to as a second frame period. The entire-region thinned-out reading pixels 84 are selected so as to have a density lower than the partial-reading pixels 85 and 86. Note that signals are not read from pixels that are not hatched in FIG. 8 in this exemplary embodiment.

Figure 9:
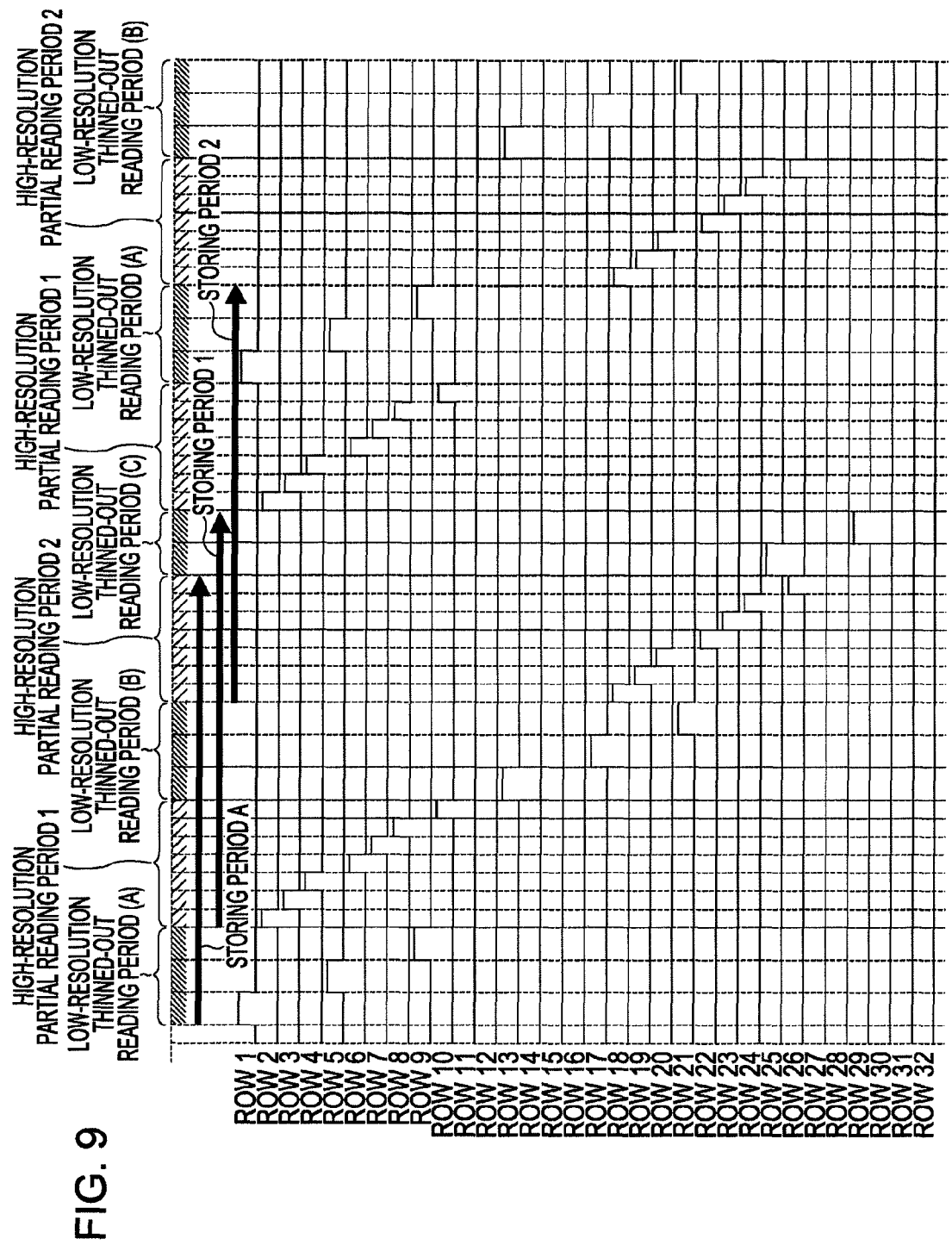
FIG. 9 is a timing chart illustrating a driving method according to the second exemplary embodiment of the present invention.

FIG. 9 shows an example of a sequence of operations of this exemplary embodiment. It is assumed that signals are read from pixels in the individual rows while corresponding pulses are at high levels.

It is assumed that, among the entire-region thinned-out reading pixels 84 corresponding to a first image, a portion including pixels in the first to 11th rows, a portion including pixels in the 12th to 22nd rows, and a portion including pixels in the 23rd to 32nd rows correspond to first to third divided images, respectively. A second frame period, in which signals are read from the partial-reading pixels 85, is inserted between a first divided frame period, in which signals are read from the pixels in the first divided image, and a second divided frame period, in which signals are read from the pixels in the second divided image. Another second frame period, in which signals are read from the partial-reading pixels 86, is further inserted between the second divided frame period, in which the signals are read from the pixels in the second divided image, and a third divided frame period, in which signals are read from the pixels in the third divided image. Furthermore, a second frame period, in which signals are read from the partial-reading pixels 85, is inserted between the third divided frame period, in which the signals are read from the pixels in the third divided image, and the first divided frame period in which the signals are read from the pixels in the first divided image. Such processing of alternately inserting a second frame period, in which the signals are read from the first partial-reading pixels 85, and another second frame period, in which the signals are read from the second partial-reading pixels 86, among the first to third divided frame periods, in which the signals are read from the pixels in the first to third divided images, is repeatedly performed thereafter.

The timings shown in FIG. 9 will now be described in detail. In the operations described above, the vertical shift register 82 scans the first row followed by the fifth and ninth rows so as to scan every four rows that include the entire-region thinned-out reading pixels 84. Thereafter, the horizontal shift register 83 scans every four columns starting from the first column to the 48th column. In this way, among the signals to be output from the entire-region thinned-out reading pixels 84, signals corresponding to the pixels included in the first divided image are output (a low-resolution thinned-out reading period (A)).

Then, the vertical shift register 82 is reset so that another operation is to be performed. The first, fifth, ninth rows are skipped, and the second to fourth rows, the sixth to eighth rows, and the 10th row are scanned. Then, the horizontal shift register 83 scans pixels in the second to fourth columns, the sixth to eighth columns, and the 10th and 11th columns which correspond to pixels in the second to fourth rows, the sixth to eighth rows, and the 10th rows. In this way, the signals are output from the partial-reading pixels 85 (a first high-resolution partial reading period).

As with the low-resolution thinned-out reading period (A), in a low-resolution thinned-out reading period (B) following the first high-resolution partial reading period, the signals read from the entire-region thinned-out reading pixels 84 included in the second divided image are output from the image pickup element.

In a second high-resolution partial reading period following the low-resolution thinned-out reading period (B), the vertical shift register 82 scans the 18th to 20th rows, the 22nd to 24th rows, and the 26th row, and the horizontal shift register 83 scans the 18th to 20th columns, the 22nd to 24th columns, and the 26th and 27th columns, whereby signals are read from the partial-reading pixels 86 in a single screen.

In a low-resolution thinned-out reading period (C), the signals read from the entire-region thinned-out reading pixels 84 included in the third divided image are output from the image pickup element. In this way, the signals output in the low-resolution thinned-out reading period (A), the signals output in the low-resolution thinned-out reading period (B), and the signals output in the low-resolution thinned-out reading period (C) constitute the entire-region thinned-out image for a single screen. Such processing of alternately inserting a second frame period, in which the signals are read from the first partial-reading pixels 85, in a single screen, and another second frame period, in which the signals are read from the second partial-reading pixels 86, in the same single screen, among the first to third divided frame periods, in which the signals are read from the pixels in the first to third divided images, which are successive images, is repeatedly performed thereafter. In this example, the first and second partial images are each updated three times while the entire-region thinned-out image is updated for two screens.

The signals output as the first to third divided images are synthesized in the signal processing circuit unit 130, for example, so that an image representing an entire imaging plane is obtained, and the image is displayed in a reproducing/displaying unit 170. The first and second partial images are also displayed in the reproducing/displaying unit 170.

The first and second partial images can be uniformly displayed with short refresh cycles by repeatedly performing the operations described above. Although the case where the two partial images are employed is taken as an example, the number of partial images is not limited to two.

Furthermore, although the first and second images are alternately read in this order in this exemplary embodiment, they may be read in reverse order.

Next, the number of partial images and the number of divided images included in the imaging plane will be described. Note that the partial images are to be updated in short cycles. If n partial images are included in the imaging plane (n is a natural number), the entire-region thinned-out image corresponding to the entire-region 71 should be divided into n+1 divided images. Specifically, if the number of second images is n, the first frame period in which the first image is read should be divided into n+1 divided frame periods or more. This is because, if the number of divided images is n or less, refresh cycles for the partial images that are to be made shorter become equal to or larger than the refresh cycle for the entire-region thinned-out image.

As described above, FIG. 7C schematically illustrates a sequence of operations according to this exemplary embodiment. On the other hand, FIG. 7D is a diagram schematically illustrating a sequence of operations according to Japanese Patent Laid-Open No. 2007-150643. As is apparent from a comparison between FIGS. 7C and 7D, in the sequence according to Japanese Patent Laid-Open No. 2007-150643, a period of time required for updating an entire image once is longer. Furthermore, because the period of time required for updating the entire image is longer, a difference between timings in which signals that are obtained from the entire image for a single screen are stored becomes larger. On the other hand, according to the sequence of this exemplary embodiment, because the refresh cycle for the entire-region thinned-out image is made shorter, the difference between the timings in which the signals that are obtained from the entire image for a single screen are stored can be made smaller.

According to this exemplary embodiment, when a refresh cycle of a partial image is required to be shorter, a constant refresh cycle of the partial image that is shorter than a general refresh cycle is attained and, therefore, an unnatural moving image can be avoided. In addition, in a case where the number of partial images of interest is n (n being a natural number), refresh cycles for the partial images of interest that are constant and that are shorter than the general refresh cycle can be attained by reading the entire-region thinned-out image in n+1 or more divided frame periods.

Third Exemplary Embodiment

A third exemplary embodiment of the present invention will now be described with reference to FIGS. 8, 10, and 11. In this exemplary embodiment, signals that are read from pixels in an entire-region thinned-out image every other row and signals that are read from pixels in other rows in the entire-region thinned-out image are alternately output, similar to interlace scanning.

FIG. 10A is a diagram schematically illustrating an effective pixel region serving as an image pickup region of an image pickup element according to this exemplary embodiment, and the effective pixel region includes a single partial image. As described above, in the second exemplary embodiment, the entire-region is vertically divided into two divided images. On the other hand, in the third exemplary embodiment, pixels of the entire-region thinned-out image obtained after pixels in the effective pixel region are thinned out are divided into a divided image 101*f* only including pixels selected every other row and a divided image 101*g* only including pixels selected from other remaining rows.

An entire-region 101 includes pixels to be subjected to an operation of outputting signals from an entire image pickup system 100 serving as the effective pixel unit of the image pickup element in a first density. A partial image 102 includes pixels to be subjected to an operation of outputting signals from a portion of the image pickup system 100 in a second density. The partial image 102 overlaps the entire-region 101. However, a description will be made hereinafter for a case in which the pixels from which signals are output in the entire-region 101 are different from the pixels from which signals are output in the partial image 102.

FIG. 10B is a diagram schematically illustrating an imaging plane in which the entire-region 101 is divided into the divided images 101*f* and 101*g*. Note that, among the pixels included in the entire-region 101, pixels selected every other row and pixels in other remaining rows are read at different timings, and densities of the pixels read in several periods are lower than a density of the pixels included in the original entire-region 101. In FIG. 10B, such a state in which a density of pixels from which signals are to be read is low in each of the divided images 101*f* and 101*g* is schematically shown by hatched lines that have a density lower than that of the hatched lines used to denote the entire-region 101, which is a region that has not yet been divided.

Although the partial-reading pixels 85 and 86 are shown in FIG. 8, the partial-reading pixels 86 are eliminated in this exemplary embodiment. Other configurations of the third exemplary embodiment are similar to those described in the second exemplary embodiment.

Figure 11:
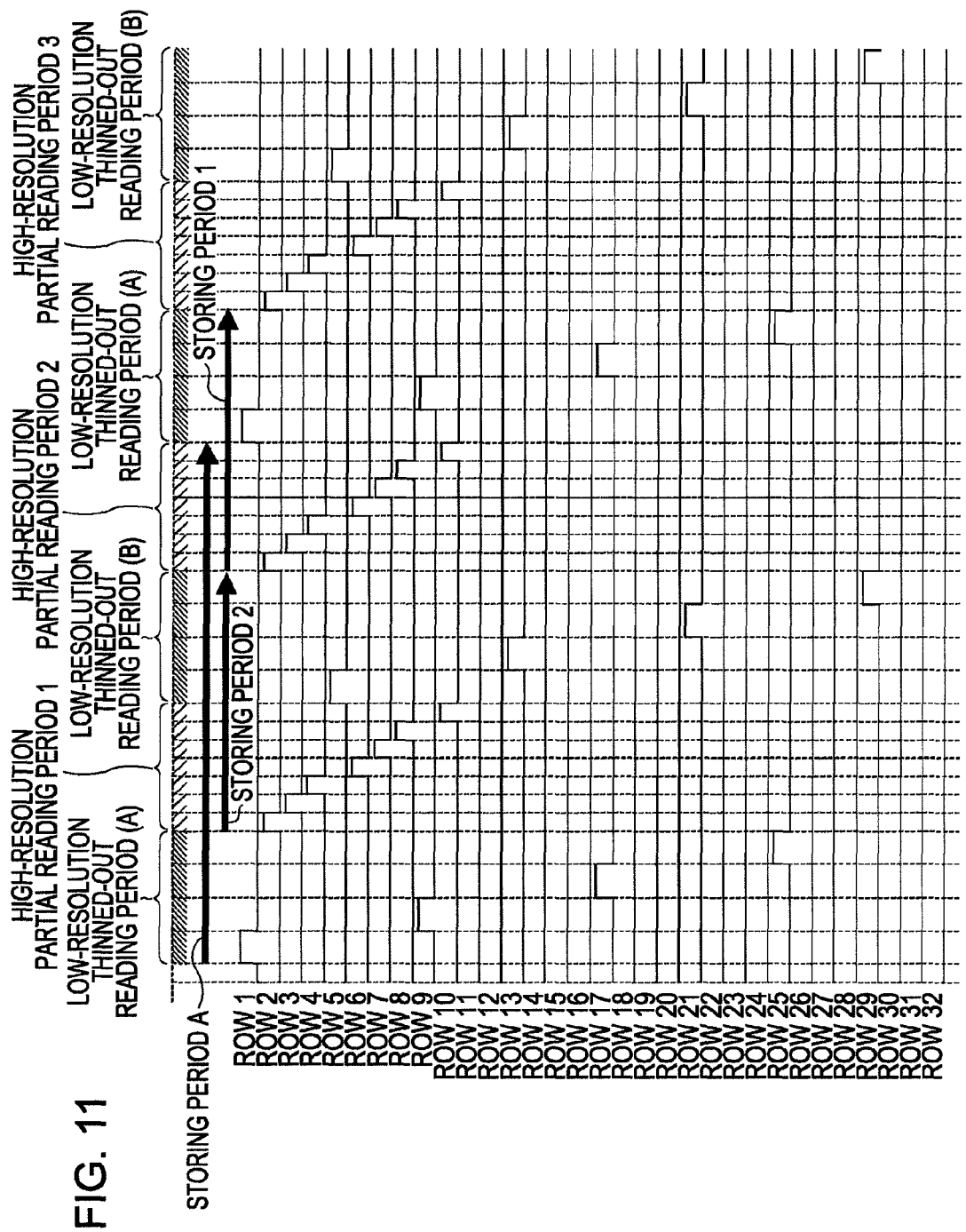
FIG. 11 is a timing chart illustrating a driving method according to the third exemplary embodiment of the present invention.

FIG. 11 shows an example of a sequence of operations according to this exemplary embodiment, and the operations of outputting signals from pixels in individual rows are performed while corresponding pulses are at high levels.

It is assumed that, among entire-region thinned-out reading pixels 84, pixels in first, ninth, 17th, and 25th rows, and pixels in fifth, 13th to 21st, and 29th rows correspond to first and second divided images, respectively. A frame period in which signals are read from the partial-reading pixels 85 is inserted between a first divided frame period, in which signals are read from the pixels in the first divided image, and a second divided frame period, in which signals are read from the pixels in the second divided image. Specifically, the entire-region thinned-out image for a single screen is divided into a plurality of divided images so that signals are obtained from the plurality of divided images, and the frame period in which signals are read from pixels included in the partial image in a single screen is inserted between the first and second divided frame periods, in which signals are obtained from the corresponding first and second divided images.

The timings shown in FIG. 11 will now be described in detail.

In a low-resolution thinned-out reading period (A) corresponding to the first divided frame period, signals read from the pixels in every other row starting from the first row, that is, the first, ninth, 17th, and 25th rows, among the first, fifth, ninth, 13th, 17th, 21st, 25th, and 29th rows included in the entire-region 101, are output.

Thereafter, in a first high-resolution partial reading period corresponding to a second frame period, signals read from pixels except for pixels in rows included in the entire-region 101, that is, pixels in the second, third, fourth, sixth, seventh, eighth, and 10th rows, among pixels included in the partial image 102 are output.

Then, in a low-resolution thinned-out reading period (B) corresponding to the second divided frame period, signals read from the pixels in other remaining rows, that is, the fifth, 13th, 21st and 29th rows, among the first, fifth, ninth, 13th, 17th, 21st, 25th, and 29th rows included in the entire-region 101, are output.

In a second high-resolution partial reading period, signals read from pixels except for pixels in rows included in the entire-region 101, that is, pixels in the second, third, fourth, sixth, seventh, eighth, and 10th rows, among pixels included in the partial image 102 are output.

By repeatedly performing the foregoing operations, the partial image, which in conventional related art is limited by a refreshing speed of the entire-region 101, can be obtained at a higher refreshing speed. According to this exemplary embodiment, the partial image is updated for two screens while the entire-region thinned-out image is updated for a single screen.

According to this exemplary embodiment, when a refresh cycle of a partial image is required to be shorter, a constant refresh cycle of the partial image which is shorter than a general refresh cycle is attained, and accordingly, an unnatural moving image can be avoided. In the first and second exemplary embodiments, since the entire-region thinned-out image is divided into a plurality of images each having slit shapes, an entire image is not obtained only by one of the divided images. On the other hand, in this exemplary embodiment, because signals are separately read from pixels in every other row and pixels included in other remaining rows in the entire-region thinned-out image, an entire image can be obtained using only one of the divided images.

Although the number of the partial images is one in this exemplary embodiment, the number of partial images may be two or more. If the number of partial images is n, the entire-region should be divided into n+1 or more images for the same reason as described for the second exemplary embodiment.

First Modification

In any of the foregoing exemplary embodiments, the number of pixels included in an entire-region thinned-out image is larger than the number of pixels included in a partial image, a frame period in which signals are read from the pixels included in the entire-region thinned-out image is divided into a plurality of divided frame periods, and a frame period in which signals are read from the pixels included in the partial image for a single screen is inserted between the plurality of divided frame periods. However, when a density of the pixels included in the entire-region thinned-out image is low, a period of time required for outputting the signals from the pixels included in the entire-region thinned-out image may be longer than a period of time required for outputting the signals from the pixels included in the partial image having a high density. In addition, a demand for making a refresh cycle of the entire-region thinned-out image shorter may arise. In this case, the entire-region thinned-out image is processed as the second image and the partial image is processed as the first image. Specifically, the signals of the pixels included in the partial image is dividedly read in a plurality of divided frame periods, and the signals of the pixels included in the entire-region thinned-out image are read for a single screen. By this arrangement, when the refresh cycle of the entire-region thinned-out image is required to be shorter, a constant refresh cycle of the entire-region thinned-out image that is shorter than a general refresh cycle is attained and, accordingly, an unnatural moving image can be avoided.

Furthermore, according to the foregoing exemplary embodiments, the number of pixels included in each of the rows of at least one of the entire-region thinned-out image and the partial image is smaller than the number of pixels included in each of the rows of the image pickup region.

Second Modification

According to the second exemplary embodiment, the frame period in which the signals are read from the entire-region thinned-out image is divided into three divided frame periods, and the number of rows of pixels, that is, the number of pixels, in the third divided image is different from the number of rows of pixels in each of the first and second divided images. Therefore, when the three divided images are similarly driven, the low-resolution thinned-out reading period (C) is shorter than each of the low-resolution thinned-out reading periods (A) and (B). Accordingly, there arises a problem in that, when similar driving methods are simply applied to the three divided images, a constant refresh cycle for the partial image may not be attained.

To address this problem, a driving frequency of a shift register may be changed. By enhancing the driving frequency of the shift register when pixels included in each of the divided images having a larger number of pixels are scanned, the low-resolution thinned-out reading periods (A), (B), and (C) may be made equal to one another so that a constant refresh cycle for the partial image is attained. Alternatively, by lowering a driving frequency of a shift register when pixels included in the divided image having a smaller number of pixels are scanned, the low-resolution thinned-out reading periods (A), (B), and (C) may be made equal to one another.

Alternatively, for example, a waiting time may be provided between the period of time in which the divided image having a smaller number of pixels are scanned and the period of time in which the divided images having a large number of pixels are scanned. By this arrangement, the low-resolution thinned-out reading period in which the divided image having a larger number of pixels are scanned and the low-resolution thinned-out reading period in which a divided image having a smaller number of pixels are scanned become equal to each other, and a constant refresh cycle for the partial image is attained.

In this way, even when the image in the image pickup region is divided into a plurality of divided images having different numbers of pixels, a constant refresh cycle for the partial image is attained.

Third Modification

Figure 12:
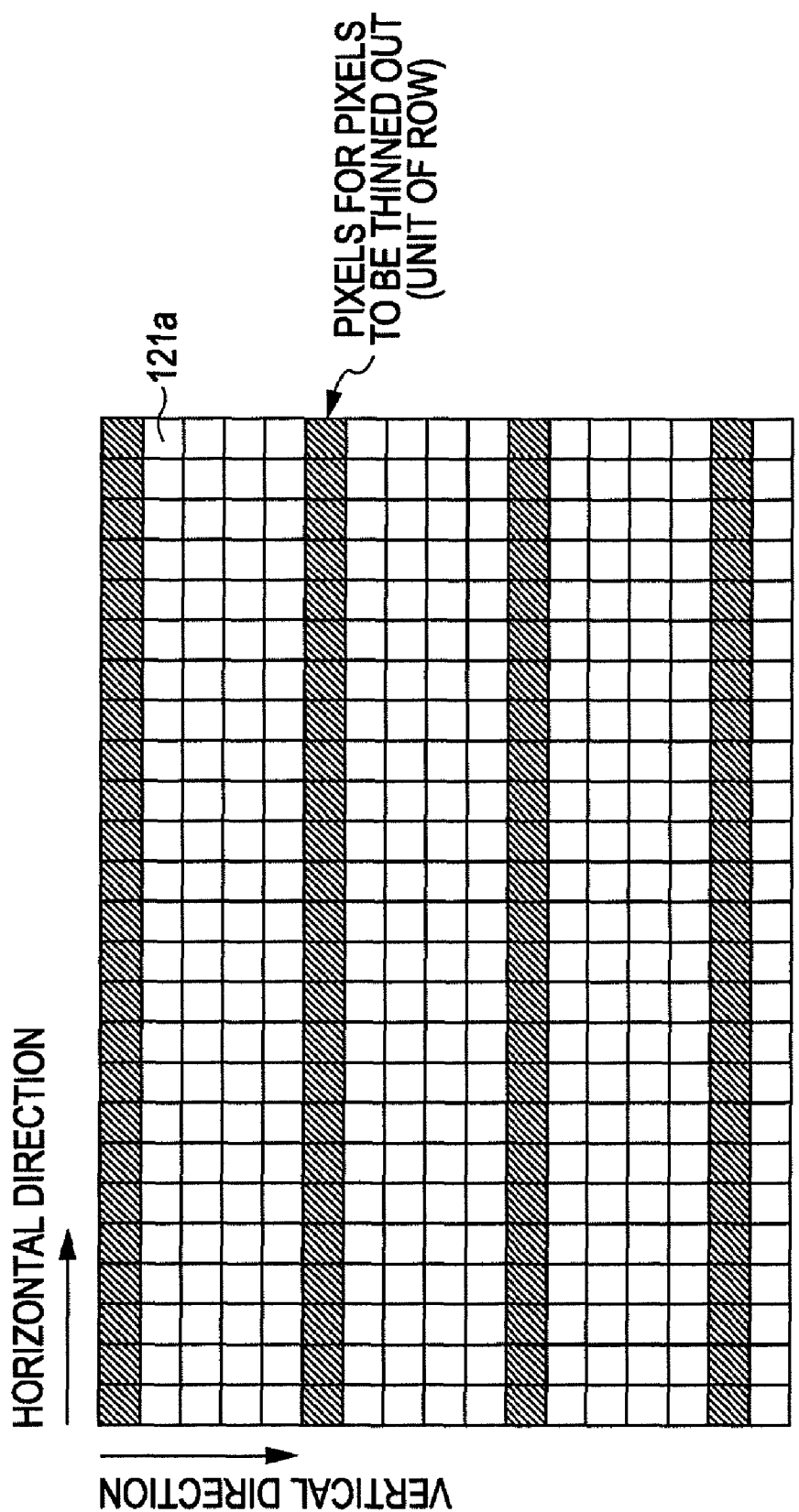
FIG. 12 is a diagram illustrating an effective pixel region according to an example embodiment of the present invention.

In the foregoing exemplary embodiments, signals are read every several pixels in the vertical direction (column direction) and the horizontal direction (row direction). However, as shown in FIG. 12, pixels may be selected every several pixels in the vertical direction whereas all pixels may be selected in the horizontal direction.

In this case, when the read signals are output as they are, an aspect ratio between the vertical direction and the horizontal direction is changed from an aspect ratio of an original imaging plane. Therefore, in order to maintain the aspect ratio of the original imaging plane, signals read from the pixels in the horizontal direction are subjected to adding processing and averaging processing. For example, when pixels from which signals are to be read are to be selected every five pixels, for pixels in the horizontal direction, signals for five pixels are subjected to the adding processing and the averaging processing so that a single signal is obtained. In this example, when compared with a case where pixels in the horizontal direction are also selected every several pixels, unwanted moire effects generated in the horizontal direction in an image are suppressed, and accordingly, deterioration of image quality is suppressed.

Fourth Modification

The examples of a possible configuration of a pixel and a possible configuration of pixels are described with reference to FIGS. 5 and 6. Here, an example of a configuration in which pixels are selected one by one will be described with reference to FIG. 13.

Figure 13:
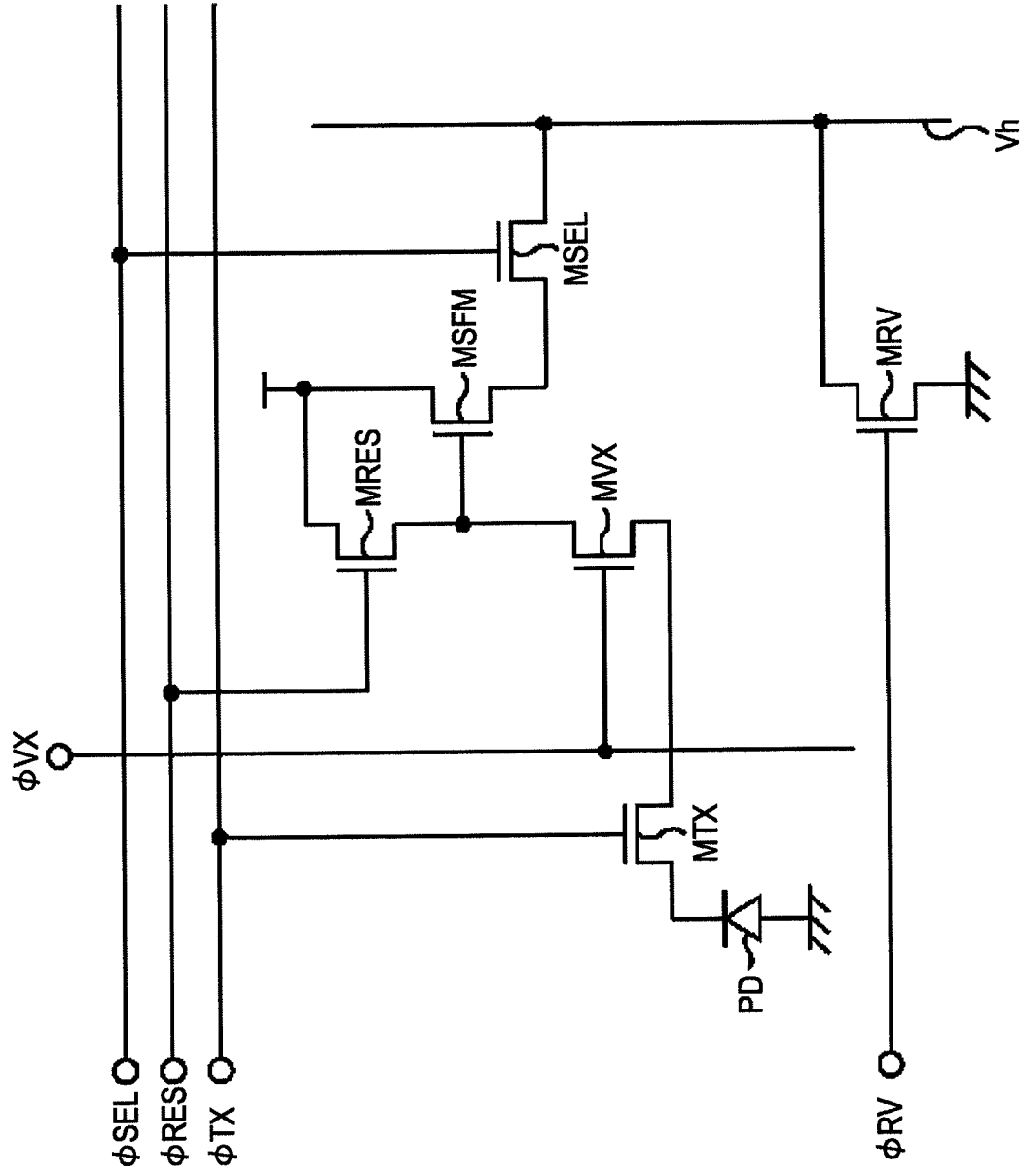
FIG. 13 is a diagram illustrating an example of a configuration of a pixel.

This example is different from the example shown in FIG. 5 in that FIG. 13 shows a pixel that includes another transfer switch MVX serving as a second transfer unit in a path that connects a transfer switch MTX serving as a first transfer unit to a gate portion (floating diffusion) of a pixel amplifier MSFM. With this configuration, while a selection switch MSEL of the pixel is in a conductive state, the transfer switch MTX is turned on, a signal $\phi TX$ is input from a vertical shift register, for example, and a signal $\phi VX$ is input from a horizontal shift register, for example. By this arrangement, signals read from arbitrary pixels obtained in random access can be output to a vertical signal line Vh.

In a pixel having such a configuration, when a photodiode PD is to be reset, the transfer switches MTX and MVX and the resetting switch MRES are brought to conductive states. By this arrangement, a charge held in the photodiode PD is discharged through the switches. When the image pickup element includes a CDS circuit (not shown), such as that described above, a signal supplied to the vertical signal line Vh immediately after the photodiode PD is reset is stored so that the signal has a reset level. The CDS circuit is used to store a signal supplied to the vertical signal line Vh due to the charge transmitted to the floating diffusion region from the photodiode PD and to output a difference between a level of the supplied signal and the reset level. In this way, an adverse effect caused by a variation in the characteristics of a pixel amplifier is reduced and thus a reduction of noise is attained. Note that the $\phi SEL$ and $\phi TX$ signals may be common signals.

According to this modification, when signals are read from the pixels included in the entire-region thinned-out image, a driving frequency of a shift register can be lowered and reduction of power consumption is attained. Furthermore, because the signals are read only from the pixels used to form the entire-region thinned-out image, the other remaining pixels may be utilized as pixels that constitute a partial image, and deterioration of quality of the partial image is avoided.

Fifth Modification

In the foregoing exemplary embodiments, because the pixels included in the entire-region thinned-out image are different from the pixels included in the partial image, discontinuity may be generated between the obtained entire-region thinned-out image and the obtained partial image. Furthermore, aspect ratios of the obtained images may be different from those in the imaging plane depending on a method used for selecting pixels. To address these problems, a portion corresponding to a missing pixel may be subjected to correction processing using signals read from adjacent pixels using a signal processing circuit unit arranged in a later stage of the image pickup element.

Sixth Modification

In a case where an image pickup system is used as a monitoring system, for example, an object in a room and an object outside the room may be included in the same imaging plane. An image of the object outside the room usually has a brightness higher than that of an image of the object in the room in the daytime and, accordingly, different regions having considerably different levels of brightness may be included in the single imaging plane. In this case, for example, the region corresponding to the image of the object outside the room is determined as a partial image, and different gains for signals can be obtained in different periods of times, that is, a period of time in which the signals are read from pixels included in the partial image and a period of time in which the signals are read from pixels included in an entire-region thinned-out image. Specifically, a low gain is set to the signals read from the pixels included in the partial image having a high brightness whereas a high gain is set to the signals read from the pixels included in the entire-region thinned-out image, whereby a range of brightness in which an object is recognizable is enlarged.

A method for realizing such an operation will be described in detail. A gain can be changed in an amplifier arranged in a vertical signal line in a known configuration of a MOS image pickup element. Furthermore, the gain may be changed in a signal processing circuit unit, for example, provided separately from the image pickup element. However, a method for amplifying signals nearer the pixels is more effective in terms of reduction of an adverse effect of noise.

Seventh Modification

In the foregoing exemplary embodiments, image pickup regions corresponding to the entire-region thinned-out image and the partial image are fixed for simplicity. However, a unit for setting the image pickup regions may be provided.

In a case where an image pickup system is used as a monitoring system, for example, when a region including a moving object as a main object is to be set to a partial image, a region corresponding to the partial image may be changed in accordance with movement of the object using a program stored in a system control circuit unit 160, for example.

In this case, the region corresponding to the partial image may not be automatically changed in accordance with the movement of the object, but the region may be set by a user. In this case, the region of the image and a density of pixels from which signals are read, for example, may be set using a region selecting unit (not shown).

Eighth Modification

The methods for driving the image pickup system and the image pickup element described above are realized by operating programs stored in a storage unit such as a RAM (Random Access Memory) or a ROM (Read-Only Memory) in a computer.

Specifically, the programs may be supplied to a computer by being recorded in a recording medium such as a CD-ROM (Compact Disc Read-Only Memory) or through a transmission medium. Other examples of recording media include a flexible disk, a hard disk, a magnetic tape, a magneto-optical disc, a nonvolatile memory, and the like. Examples of transmission media include computer network systems such as a LAN (Local Area Network) or a WAN (Wide Area Network), including the Internet, a wired line using an optical fiber or an electric line, and a wireless transmission using a radio wave.

In addition to the realization of the methods by executing the supplied programs using the computer, functions of the image pickup system may be realized by operating the programs collaboratively with an operating system in the computer or with application software. Furthermore, the functions of the image pickup system may be realized by performing an entire or part of the processing of the supplied programs using a function expansion board or a function expansion unit included in the computer.

Although aspects of the present invention have been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-327400 filed Dec. 19, 2007 and No. 2008-256416 filed Oct. 1, 2008, which are hereby incorporated by reference herein in their entirety.

What is claimed is:

1. An image pickup system comprising: an image pickup element including an image pickup region in which a plurality of pixels are arranged in a matrix; and a controller configured to control reading of signals from the plurality of pixels, wherein the controller divides a first frame period, in which a first image is read from the image pickup element, into a plurality of divided frame periods including first and second divided frame periods, wherein, when a number of pixels included in the first image is larger than a number of pixels included in a second image, a second frame period required for reading all signals from the pixels included in the second image is inserted between the first and second divided frame periods, wherein a refresh cycle of the second image is shorter than a refresh cycle of the first image, and wherein, when the first divided frame period is shorter than the second divided frame period, the controller adds a waiting time to the first divided frame period so that a sum of the first divided frame period and the waiting time is equal to the second divided frame period.

2. The image pickup system according to claim 1, wherein, when n second images are employed, n being a natural number, the first frame period is divided into n+1 or more divided frame periods.

3. The image pickup system according to claim 1, wherein, when a plurality of second images corresponding to portions of the image pickup region are employed, one of the second frame periods is inserted between the first and second divided frame periods.

4. The image pickup system according to claim 1, wherein, when a number of pixels read in the first divided frame period is smaller than a number of pixels read in the second divided frame period, the controller controls a frequency of scanning of the pixels read in the first divided frame period to be lower than a frequency of scanning of the pixels read in the second divided frame period.

5. The image pickup system according to claim 1, further comprising:
   a region selecting unit configured to set regions in the image pickup region corresponding to the first and second images.

6. The image pickup system according to claim 1,
   wherein the first image corresponds to the image pickup region in its entirety, and
   wherein the second image corresponds to a portion of the image pickup region.

7. The image pickup system according to claim 6, wherein a density of the pixels included in the first image is lower than a density of the pixels included in the second image.

8. The image pickup system according to claim 1,
   wherein the first image corresponds to a portion of the image pickup region,
   wherein the second image corresponds to the image pickup region in its entirety, and
   wherein a density of the pixels included in the first image is higher than a density of the pixels included in the second image.

9. A method for driving an image pickup element so that signals are read from pixels included in first and second images and output from the image pickup element, the image pickup element including an image pickup region in which a plurality of pixels are arranged in a matrix, the method comprising: dividing, using a controller, a first frame period, in which signals are read from the pixels included in the first image, into a plurality of divided frame periods including first and second divided frame periods, when a number of the pixels included in the first image is larger than a number of the pixels included in the second image, inserting a second frame period, which is required for reading all signals from the pixels included in the second image, between the first and second divided frame periods, making a refresh cycle of the second image shorter than a refresh cycle of the first image, and adding a waiting time to the first divided frame period so that a sum of the first divided frame period and the waiting time is equal to the second divided frame period, when the first divided frame period is shorter than the second divided frame period inserting the divided frame period.

10. The method for driving an image pickup element according to claim 9, wherein, when n second images are employed, n being a natural number, the first frame period is divided into n+1 or more divided frame periods.

11. The method for driving an image pickup element according to claim 9, wherein, when a plurality of second images corresponding to portions of the image pickup region are employed, a second frame period is inserted between the first and second divided frame periods.

12. The method for driving the image pickup element according to claim 9, wherein, when a number of pixels read in the first divided frame period is smaller than a number of pixels read in the second divided frame period, a frequency of scanning of the pixels read in the first divided frame period is lower than a frequency of scanning of the pixels read in the second divided frame period.

13. The method for driving the image pickup element according to claim 9,
    wherein the first image corresponds to the image pickup region in its entirety, and
    wherein the second image corresponds to a portion of the image pickup region.

14. The method for driving the image pickup element according to claim 13, wherein a density of the pixels included in the first image is lower than a density of the pixels included in the second image.

15. The method for driving the image pickup element according to claim 9,
    wherein the first image corresponds to a portion of the image pickup region, and
    wherein the second image corresponds to the image pickup region in its entirety.

16. A computer-readable recording medium storing a computer program that when executed by a computer causes the computer to perform a method for driving an image pickup element so that signals are read from pixels included in first and second images and output from the image pickup element, wherein the image pickup element including an image pickup region in which a plurality of pixels are arranged in a matrix, and wherein the method includes: dividing a first frame period, in which signals are read from the pixels included in the first image, into a plurality of divided frame periods including first and second divided frame periods, when a number of the pixels included in the first image is larger than a number of the pixels included in the second image, inserting a second frame period, which is required for reading all signals from the pixels included in the second image, between the first and second divided frame periods, making a refresh cycle of the second image shorter than a refresh cycle of the first image, and adding a waiting time to the first divided frame period so that a sum of the first divided frame period and the waiting time is equal to the second divided frame period, when the first divided frame period is shorter than the second divided frame period.

* * * * *